(12) United States Patent
Parikh et al.

(10) Patent No.: US 7,994,512 B2
(45) Date of Patent: *Aug. 9, 2011

(54) GALLIUM NITRIDE BASED DIODES WITH LOW FORWARD VOLTAGE AND LOW REVERSE CURRENT OPERATION

(75) Inventors: Primit Parikh, Goleta, CA (US); Umesh Mishra, Santa Barbara, CA (US)

(73) Assignee: Cree, Inc., Goleta, CA (US)

( * ) Notice: Subject to any disclaimer, the term of this patent is extended or adjusted under 35 U.S.C. 154(b) by 29 days.

This patent is subject to a terminal disclaimer.

(21) Appl. No.: 11/173,035

(22) Filed: Jun. 30, 2005

(65) Prior Publication Data

US 2005/0242366 A1 Nov. 3, 2005

Related U.S. Application Data

(60) Continuation of application No. 10/163,944, filed on Jun. 6, 2002, now Pat. No. 6,949,774, which is a division of application No. 09/911,155, filed on Jul. 23, 2001, now abandoned.

(51) Int. Cl.
*H01L 29/861* (2006.01)
*H01L 29/88* (2006.01)
*H01L 29/20* (2006.01)

(52) U.S. Cl. ... 257/76; 257/201; 257/615; 257/E29.327; 257/E29.339

(58) Field of Classification Search ............ 257/472, 257/473, 485, 486, 30, 46, 76, 77, 471, 928, 257/199, E21.353, E21.367, E29.339, E29.34, 257/603, 604, E29.327, E29.332, E29.341, 257/E21.352, E21.365, E21.366, 201, 615

See application file for complete search history.

(56) References Cited

U.S. PATENT DOCUMENTS 4,152,044 A 5/1979 Liu
(Continued)

FOREIGN PATENT DOCUMENTS

EP 0936682 8/1999
(Continued)

OTHER PUBLICATIONS

Sugimura et al. "I-V Characteristics of Schottky/Metal-Insulator-Semiconductor Diodes with Tunnel Thin Barriers". Japanese Journal of Applied Physics, vol. 39, Part 1, No. 7B, Jul. 30, 2000).*

(Continued)

*Primary Examiner* — Lynne A Gurley
*Assistant Examiner* — Andrew O. Arena
(74) *Attorney, Agent, or Firm* — Koppel, Patrick, Heybl & Philpott

(57) ABSTRACT

New Group III based diodes are disclosed having a low on state voltage ($V_f$) and structures to keep reverse current ($I_{rev}$) relatively low. One embodiment of the invention is Schottky barrier diode made from the GaN material system in which the Fermi level (or surface potential) of is not pinned. The barrier potential at the metal-to-semiconductor junction varies depending on the type of metal used and using particular metals lowers the diode's Schottky barrier potential and results in a $V_f$ in the range of 0.1-0.3V. In another embodiment a trench structure is formed on the Schottky diodes semiconductor material to reduce reverse leakage current. and comprises a number of parallel, equally spaced trenches with mesa regions between adjacent trenches. A third embodiment of the invention provides a GaN tunnel diode with a low $V_f$ resulting from the tunneling of electrons through the barrier potential, instead of over it. This embodiment can also have a trench structure to reduce reverse leakage current.

16 Claims, 3 Drawing Sheets

U.S. PATENT DOCUMENTS

| | | | |
|---|---|---|---|
| 4,914,489 A * | 4/1990 | Awano | 257/6 |
| 4,963,948 A * | 10/1990 | Awano | 257/183 |
| 5,034,783 A | 7/1991 | Chang et al. | 257/14 |
| 5,477,436 A | 12/1995 | Bertling et al. | |
| 5,612,567 A | 3/1997 | Baliga | 257/475 |
| 5,628,917 A | 5/1997 | MacDonald et al. | 216/2 |
| 6,046,464 A | 4/2000 | Schetzina | |
| 6,093,952 A | 7/2000 | Bandic et al. | 257/485 |
| 6,150,672 A * | 11/2000 | Kaneko | 257/94 |
| 6,330,111 B1 | 12/2001 | Myers | |
| 6,331,915 B1 | 12/2001 | Myers | |
| 6,331,944 B1 * | 12/2001 | Monsma et al. | 365/171 |
| 6,389,051 B1 * | 5/2002 | Van de Walle et al. | 372/45.01 |
| 6,504,179 B1 | 1/2003 | Ellens et al. | 257/88 |
| 6,526,082 B1 * | 2/2003 | Corzine et al. | 372/46.01 |
| 6,657,393 B2 | 12/2003 | Natsume | |
| 6,746,889 B1 | 6/2004 | Eliashevich et al. | |
| 6,784,463 B2 | 8/2004 | Camras et al. | |
| 6,878,975 B2 * | 4/2005 | Hueschen | 257/104 |
| 6,882,051 B2 * | 4/2005 | Majumdar et al. | 257/746 |
| 6,932,497 B1 | 8/2005 | Huang | |
| 6,949,774 B2 * | 9/2005 | Parikh et al. | 257/104 |
| 7,087,936 B2 | 8/2006 | Negley | |
| 7,194,170 B2 | 3/2007 | Biegelsen | 385/116 |
| 7,214,626 B2 | 5/2007 | Huang | 438/734 |
| 2002/0015013 A1 | 2/2002 | Ragle | |
| 2002/0054495 A1 | 5/2002 | Natsume | |
| 2003/0015708 A1 | 1/2003 | Parikh et al. | |
| 2003/0085409 A1 | 5/2003 | Shen et al. | |
| 2003/0218183 A1 | 11/2003 | Micovic et al. | |
| 2004/0207313 A1 | 10/2004 | Omoto et al. | |
| 2005/0117320 A1 | 6/2005 | Leu et al. | |
| 2005/0158637 A1 | 7/2005 | Kim et al. | |
| 2005/0173692 A1 | 8/2005 | Park et al. | |
| 2005/0173728 A1 | 8/2005 | Saxler | |
| 2005/0219668 A1 | 10/2005 | Taghizadeh | |
| 2006/0081862 A1 | 4/2006 | Chua et al. | |
| 2006/0158899 A1 | 7/2006 | Avabe et al. | |
| 2006/0220046 A1 | 10/2006 | Yu et al. | |
| 2007/0007558 A1 | 1/2007 | Mazzochette | |
| 2007/0090383 A1 | 4/2007 | Ota et al. | |
| 2007/0268694 A1 | 11/2007 | Bailey et al. | |
| 2008/0036364 A1 | 2/2008 | Li et al. | |

FOREIGN PATENT DOCUMENTS

| | | | |
|---|---|---|---|
| EP | 0936682 A | | 8/1999 |
| EP | 1349202 A | | 10/2003 |
| EP | 1653255 | | 5/2006 |
| EP | 1681509 | | 7/2006 |
| FR | 2586844 | | 3/1987 |
| FR | 2759188 | | 8/1998 |
| FR | 2814220 | | 3/2002 |
| JP | 2297965 | | 12/1990 |
| WO | WO 9837584 A1 * | | 8/1998 |
| WO | WO 9856043 | | 12/1998 |
| WO | WO 0111693 A1 | | 2/2001 |
| WO | WO 0211212 A | | 2/2002 |
| WO | 03044870 | | 5/2003 |
| WO | WO 03080763 | | 10/2003 |
| WO | WO 2007005844 A | | 1/2007 |

OTHER PUBLICATIONS

Kwok K. Ng, Complete Guide to Semiconductor Devices, 1995, McGraw-Hill, 1st ed, p. 48-53. (9 pages attached, including cover and copyright pages).*

Kwok K. Ng, , Complete Guide to Semiconductor Devices, 2002, Wiley-Interscience, 2nd ed, p. 42-63. (27 pages attached, including cover, copyright, and part of table of contents).*

Notice Requesting Submission of Opinion re related Korean Application No. 10-2004-7001033, dated: Mar. 9, 2009.

Sakai et al., "Experimental Investigation of Dependence of Electrical Characteristics on Device Parameters in Trench MOS Barrier Shottky Diodes", Proceedings of 1998 International Symposium on Power Semiconductor Devices & ICs, Kyoto, pp. 293-296, Jun. 1998.

Zhang AP et al, "Comparison of GaN P-I-N and Schottky Rectifier Performance" IEEE Transactions on Electron Devices, IEEE Inc. New York, US, vol. 48, No. 3, pp. 407-411, Mar. 2001.

European Search Report, Feb. 24, 2009, re related European Application No. EP 08253301.

Official Notice of Rejection mailed on Jun. 10, 2008, Japan Patent Application No. 2003-529535.

Patent Abstracts of Japan, Pub. No. 2000-150920, Pub. Date: May 30, 2000.

Office Action from related U.S. Appl. No. 11/600,617, dated: Dec. 22, 2009.

European Search Report from related European Application No. 07254498.4.

Office Action from related U.S. Appl. No. 10/445,130, dated: Mar. 26, 2004.

Response to related Office Action U.S. Appl. No. 10/445,130 Dated: May 27, 2004.

Office Action from related U.S. Appl. No. 10/445,130, dated: Jul. 16, 2004.

Response to related Office Action U.S. Appl. No. 10/445,130, dated: Dec. 16, 2004.

Office Action from related U.S. Appl. No. 10/445,130, dated: Apr. 5, 2005.

Response to related Office Action U.S. Appl. No. 10/445,130, dated: Sep. 6, 2005.

Office Action from related U.S. Appl. No. 10/445,130, dated: Nov. 15, 2005.

Response to related Office Action U.S. Appl. No. 10/445,130, dated: Mar. 15, 2006.

Office Action from related U.S. Appl. No. 10/445,130, dated: Jun. 13, 2006.

Response to related Office Action U.S. Appl. No. 10/445,130, dated: Dec. 13, 2006.

Office Action from related U.S. Appl. No. 10/445,130, dated: Mar. 22, 2007.

Response to related Office Action U.S. Appl. No. 10/445,130, dated: Aug. 22, 2007.

Office Action from related U.S. Appl. No. 10/445,130, dated: Nov. 15, 2007.

Response to related Office Action U.S. Appl. No. 10/445,130, dated: May 15, 2008.

Notice of Allowance of related U.S. Appl. No. 10/445,130, dated: Aug. 22, 2008.

Office Action from U.S. Appl. No. 11/498,418, dated: Dec. 16, 2009.

Response to Office Action from U.S. Appl. No. 11/498,418, filed: May 16, 2010.

Office Action from U.S. Appl. No. 12/151,089, dated: May 11, 2010.

Office Action from U.S. Appl. No. 11/974,431, dated: Apr. 14, 2010.

Response to Office Action from U.S. Appl. No. 11/974,431, filed: Jul. 6, 2010.

Office Action from U.S. Appl. No. 11/818,818, dated: May 11, 2010.

Office Action from U.S. Appl. No. 11/900,952, dated: Jul. 23, 2010.

Office Action from U.S. Appl. No. 11/982,275, dated: Aug. 20, 2010.

Office Action from U.S. Appl. No. 11/498,418, dated: Sep. 15, 2010.

Office Action from U.S. Appl. No. 11/974,431, dated:Sep. 22, 2010.

Copending U.S. Appl. No. 11/443,741, date: Jun. 14, 2007.

Copending U.S. Appl. No. 11/685,761, date: Mar. 13, 2007.

Copending U.S. Appl. No. 11/939,059, date: Nov. 13, 2007.

PCT Search Report and Written Opinion PCT/US2007/086237, date: May 8, 2008 in related application.

PCT Search Report and Written Opinion PCT/US2007/12403, Date: Aug. 6, 2008.

PCT Search Report and Written Opinion PCT/US2007/086242, Date: Mar. 4, 2008.

Copending U.S. Appl. No. 11/613,692, filed Dec. 20, 2006.

Copending U.S. Appl. No. 11/614,180, filed Dec. 21, 2006.

Copending U.S. Appl. No. 11/624,811, filed Jan. 19, 2007.

Copending U.S. Appl. No. 11/743,754, filed May 3, 2007.

Copending U.S. Appl. No. 11/751,982, filed May 22, 2007.

Copending U.S. Appl. No. 11/753,103, filed May 24, 2007.

Copending U.S. Appl. No. 11/751,990, filed May 22, 2007.

Copending U.S. Appl. No. 11/755,153, filed May 30, 2007.

Copending U.S. Appl. No. 11/856,421, filed Sep. 17, 2007.

Copending U.S. Appl. No. 11/859,048, filed Sep. 21, 2007.

Copending U.S. Appl. No. 11/939,047, filed Nov. 13, 2007.
Copending U.S. Appl. No. 11/936,163, filed Nov. 7, 2007.
Copending U.S. Appl. No. 11/843,243, filed Aug. 22, 2007.
Copending U.S. Appl. No. 11/939,052, filed Nov. 13, 2007.
Copending U.S. Appl. No. 11/736,799, filed Apr. 18, 2007.
Copending U.S. Appl. No. 11/877,038, filed Oct. 23, 2007.
Copending U.S. Appl. No. 11/870,679, filed Oct. 11, 2007.
Copending U.S. Appl. No. 11/948,041, filed Nov. 30, 2007.
Copending U.S. Appl. No. 11/949,222, filed Dec. 3, 2007.
Copending U.S. Appl. No. 12/174,053, filed Jul. 16, 2008.
Copending U.S. Appl. No. 12/002,429, filed Dec. 4, 2007.
Copending U.S. Appl. No. 12/045,729, filed Mar. 11, 2008.
Copending U.S. Appl. No. 11/818,818, filed Jun. 14, 2007.
Notice of First Office Action from related China Patent Application No. 200710142217.6, dated: Jun. 22, 2009.
Zhang A P et al, "Comparison of GaN P-I-N and Schottky Rectifier Performance", IEEE Transactions on Electron Devices, IEEE Inc. New York, US, vol. 48, No. 3, March 2001, pp. 407-411.
Mohammad S N et al., "Near-Ideal Platinum-GZN Schottky Diodes", Electronics Letters, IEEE Stevenage, GB, vol. 32, No. 6, Mar. 14, 1996, p. 598-599, XP006004867, ISSN, 0013-5194.
Schmitz A C A et al., "Metal Contacts to N-Type GaN", III-V Nitrides and Silicon Carbide, Fort Collins, CO, USA, 1997, vol. 27, No. 4, pp. 255-260, XP008016192, Journal of Electronic Materials, Apr. 1998, TMS, USA, ISSN, 0361-5235.
Data Sheet for IXYS Corporation, Si Bas3ed Power Schottky Rectifier, Part No. DSS 20-0015B, 1998.
M. Mehrotra, B.J. Baliga, "The Trench MOS Barrier Shottky (TMBS) Rectifier", International Electron Device Meeting, 1993. 28.2.1-28.2.4.
L.P. Hunter, "Physics of Semiconductor Materials, Devices, and Circuits", Semiconductor Devices, pp. 3-2-3-7 (1970).
Binari et al., "Electrical Characterization of Ti Schottky Barriers on N-Type GaN", Electronics Letters, May 26, 1994 vol. 30, pp. 909-911.
American Institute of Physics Handbook, pp. 9-172-9-177, 1982.
Denisenko at al., Device Research Conference, Denver, CO USA, pp. 75-76, Jun. 2000.
Ng, Complete Guide to Semiconductor Devices, McGraw-Hill, Inc. 1995, pp. 30-39.
Official Communication from the EPO regarding related European Application 08253301.9, dated: Nov. 17, 2009.
Second Office Action from related Chinese Application No. 200710142217.6, dated: Nov. 6, 2009.
Zhang at al. "Comparison of GaN P-I-N and Schottky Rectifier Performance", IEEE Transactions on Electron Devices, vol. 48, No. 3, Mar. 2001, pp. 407-411.
European Search Report re related European Application No. 08253301.9-2222. Feb. 24, 2009.
European Search Report re related EP Appl. 08160129.6.2222, Dated: Dec. 15, 2008.
Asbeck at al."Enhancement of Base Conductivity Via the Piezoelectric Effect in AlGaN/GaN HBTs", Solid State Electronics, Elsevier Science Pub. Barking GB, vol. 44, No. 2, Feb. 1, 2000 pp. 211-219, XP004186190.
Johnson et al."New UV Light Emitter Based on AlGaN Heterostructures with Graded Electron and Hole Injectors", Materials Research Society Symposium—Proceedings 2002 Materials Research Society US, vol. 743, 2002, pp. 481-486.
Simon et al. "Polarization-Induced 3-Dimensional Electron Slabs in Graded AlGaN Layers", Materials Research Society Symposium Proceedings 2006 Materials Research Society US, vol. 892, Nov. 28, 2005, pp. 417-422.
Official Notice of Final Decision of Rejection re related Japanese Patent Appl. No. 2003-529535, Dated: Jan. 6, 2009.
European Communication from related European Appl. 02 798 906.0-1235, Dated Feb. 6, 2009.

* cited by examiner

GALLIUM NITRIDE BASED DIODES WITH LOW FORWARD VOLTAGE AND LOW REVERSE CURRENT OPERATION

This application is a continuation of U.S. patent application Ser. No. 10/163,944, filed on Jun. 6, 2002 now U.S. Pat. No. 6,949,774, which was a divisional of U.S. patent application Ser. No. 09/911,155, filed on Jul. 23, 2001 now abandoned. This application claims the benefit of both these applications.

This invention was made with Government support under Contract No. AH040600-2, awarded by Raytheon/Air Force. The Government has certain rights in this invention.

BACKGROUND OF THE INVENTION

1. Field of the Invention

This invention relates to diodes, and more particularly to gallium nitride (GaN) based diodes exhibiting improved forward voltage and reverse leakage current characteristics.

2. Description of the Related Art

Diode rectifiers are one of the most widely used devices for low voltage switching, power supplies, power converters and related applications. For efficient operation it is desirable for diodes to have low on-state voltage (0.1-0.2V or lower), low reverse leakage current, high voltage blocking capability (20-30V), and high switching speed.

The most common diodes are pn-junction diodes made from silicon (Si) with impurity elements introduced to modify, in a controlled manner, the diode's operating characteristics. Diodes can also be formed from other semiconductor materials such as Gallium Arsenide (GaAs) and silicon carbide (SiC). One disadvantage of junction diodes is that during forward conduction the power loss in the diode can become excessive for large current flow.

Schottky barrier diodes are a special form of diode rectifier that consist of a rectifying metal-to-semiconductor barrier area instead of a pn junction. When the metal contacts the semiconductor a barrier region is developed at the junction between the two. When properly fabricated the barrier region will minimize charge storage effects and improve the diode switching by shortening the turn-off time. [L. P. Hunter, *Physics of Semiconductor Materials, Devices, and Circuits*, Semiconductor Devices, Page 1-10 (1970)] Common Schottky diodes have a lower turn-on voltage (approximately 0.5V) than pn-junction diodes and are more desirable in applications where the energy losses in the diodes can have a significant system impact (such as output rectifiers in switching power supplies).

One way to reduce the on-state voltage below 0.5V in conventional Schottky diodes is to reduce their surface barrier potential. This, however, results in a trade-off of increased reverse leakage current. In addition, the reduced barrier can degrade high temperature operation and result in soft breakdown characteristics under reverse bias operation.

Also, Schottky diodes are commonly made of GaAs and one disadvantage of this material is that the Fermi level (or surface potential) is fixed or pinned at approximately 0.7 volts. As a result, the on-state forward voltage ($V_f$) is fixed. Regardless of the type of metal used to contact the semiconductor, the surface potential cannot be lowered to lower the $V_f$.

More recently, silicon based Schottky rectifier diodes have been developed with a somewhat lower $V_f$. [IXYS Corporation, Si Based Power Schottky Rectifier, Part Number DSS 20-0015B; International Rectifier, Si Based Shottky Rectifier, Part Number 11DQ09]. The Shottky barrier surface potential of these devices is approximately 0.4V with the lower limit of $V_f$ being approximately 0.3-0.4 volts. For practical purposes the lowest achievable Shottky barrier potential is around 0.4 volts with regular metalization using titanium. This results in a $V_f$ of approximately 0.25V with a current density of 100 A/cm².

Other hybrid structures have been reported with a $V_f$ of approximately 0.25V (with a barrier height of 0.58V) with operating current density of 100 A/cm². [M. Mehrotra, B. J. Baliga, "The Trench MOS Barrier Shottky (TMBS) Rectifier", International Electron Device Meeting, 1993]. One such design is the junction barrier controlled Schottky rectifier having a pn-junction used to tailor the electric fields to minimize reverse leakage. Another device is the trench MOS barrier rectifier in which a trench and a MOS barrier action are used to tailor the electrical field profiles. One disadvantage of this device is the introduction of a capacitance by the pn-junction. Also, pn-junctions are somewhat difficult to fabricate in Group III nitride based devices.

The Gallium nitride (GaN) material system has been used in opto-electronic devices such as high efficiency blue and green LEDs and lasers, and electronic devices such as high power microwave transistors. GaN has a 3.4 eV wide direct bandgap, high electron velocity ($2\times10^7$ cm/s), high breakdown fields ($2\times10^6$ V/cm) and the availability of heterostructures.

SUMMARY OF THE INVENTION

The present invention provides new Group III nitride based diodes having a low $V_f$. Embodiments of the new diode also include structures to keep reverse current ($I_{rev}$) relatively low.

The new diode is preferably formed of the GaN material system, and unlike conventional diodes made from materials such as GaAs, the Fermi level (or surface potential) of GaN is not pinned at its surface states. In GaN Schottky diodes the barrier height at the metal-to-semiconductor junction varies depending on the type of metal used. Using particular metals will lower the diode's Schottky barrier height and result in a $V_f$ in the range of 0.1-0.3V.

The new GaN Schottky diode generally includes an n+ GaN layer on a substrate, and an n– GaN layer on the n+ GaN layer opposite the substrate. Ohmic metal contacts are included on the n+ GaN layer, isolated from the n– GaN layer, and a Schottky metal layer is included on the n– GaN layer. The signal to be rectified is applied to the diode across the Schottky metal and ohmic metal contacts. When the Schottky metal is deposited on the n– GaN layer, a barrier potential forms at the surface of said n– GaN between the two. The Schottky metal layer has a work function, which determines the height of the barrier potential.

Using a metal that reduces the Schottky barrier potential results in a low $V_f$, but can also result in an undesirable increase in $I_{rev}$. A second embodiment of the present invention reduces $I_{rev}$ by including a trench structure on the diode's surface. This structure prevents an increase in the electric field when the new diode is under reverse bias. As a result, the Schottky barrier potential is lowered, which helps reduce $I_{rev}$.

The trench structure is preferably formed on the n– GaN layer, and comprises a number of parallel, equally spaced trenches with mesa regions between adjacent trenches. Each trench has an insulating layer on its sidewalls and bottom surface. A continuous Schottky metal layer is on the trench structure, covering the insulating layer and the mesas between the trenches. Alternatively, the sidewalls and bottom surface of each trench can be covered with metal instead of an insulator, with the metal electrically isolated from the Schottky metal. The mesa regions have a doping concentration and width chosen to produce the desired redistribution of electrical field under the metal-semiconductor contact.

A third embodiment of the invention provides a GaN tunnel diode with a low $V_f$ resulting from the tunneling of electrons through the barrier potential, instead of over it. This embodiment has a substrate with an n+ GaN layer sandwiched between the substrate and an n− GaN layer. An AlGaN barrier layer is included on the n− GaN layer opposite the n+ GaN layer. An Ohmic contact is included on the n+ GaN layer and a top contact is included on the AlGaN layer. The signal to be rectified is applied across the Ohmic and top contacts.

The barrier layer design maximizes the forward tunneling probability while the different thickness and Al mole fraction of the barrier layer result in different forward and reverse operating characteristics. At a particular thickness and Al mole fraction, the diode has a low $V_f$ and low $I_{rev}$. Using a thicker barrier layer and/or increasing the Al mole concentration decreases $V_f$ and increases $I_{rev}$. As the thickness or mole fraction is increased further, the new diode will assume ohmic operating characteristics, or become a conventional Schottky diode.

These and other further features and advantages of the invention would be apparent to those skilled in the art from the following detailed description, taking together with the accompanying drawings, in which:

DETAILED DESCRIPTION OF THE INVENTION

Figure 1:
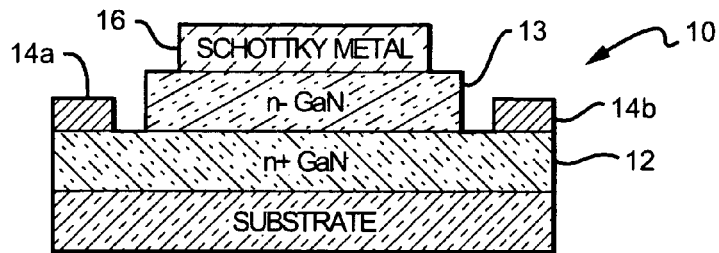
FIG. 1 is a sectional view of a GaN Schottky diode embodiment of the invention.

FIG. 1 shows a Schottky diode 10 constructed in accordance with the present invention having a reduced metal-to-semiconductor barrier potential. The new diode is formed of the Group III nitride based material system or other material systems where the Fermi level is not pinned at its surface states. Group III nitrides refer to those semiconductor compounds formed between nitrogen and the elements in Group III of the periodic table, usually aluminum (Al), gallium (Ga), and indium (In). The term also refers to ternary and tertiary compounds such as AlGaN and AlInGaN. The preferred materials for the new diode are GaN and AlGaN.

The new diode 10 comprises a substrate 11 that can be either sapphire ($Al_2O_3$), silicon (Si) or silicon carbide (SiC), with the preferred substrate being a 4H polytype of silicon carbide. Other silicon carbide polytypes can also be used including 3C, 6H and 15R polytypes. An $Al_xGa_{1-x}N$ buffer layer 12 (where x is in between 0 and 1) is included on the substrate 11 and provides an appropriate crystal structure transition between the silicon carbide substrate and the remainder of the diode 10.

Silicon carbide has a much closer crystal lattice match to Group III nitrides than sapphire and results in Group III nitride films of higher quality. Silicon carbide also has a very high thermal conductivity so that the total output power of Group III nitride devices on silicon carbide is not limited by the thermal dissipation of the substrate (as is the case with some devices formed on sapphire). Also, the availability of silicon carbide substrates provides the capacity for device isolation and reduced parasitic capacitance that make commercial devices possible. SiC substrates are available from Cree Research, Inc., of Durham, N.C. and methods for producing them are set forth in the scientific literature as well as in a U.S. Pat. Nos. Re. 34,861; 4,946,547; and 5,200,022.

The new diode 10 has an n+ GaN layer 12 on a substrate 11 and an n− layer of GaN 13 on the n+ GaN layer 12, opposite the substrate 11. The n+ layer 12 is highly doped with impurities to a concentration of at least $10^{18}$ per centimeter cubed ($cm^3$), with the preferable concentration being 5 to 10 times this amount. The n− layer 13 has a lower doping concentration but is still n− type and it preferably has an impurity concentration in the range of $5 \times 10^{14}$ to $5 \times 10^{17}$ per $cm^3$. The n-layer 13 is preferably 0.5-1 micron thick and the n+ layer 12 is 0.1 to 1.5 microns thick, although other thicknesses will also work.

Portions of the n− GaN layer 13 are etched down to the n+ layer and ohmic metal contacts 14a and 14b are included on the n+ GaN layer in the etched areas so that they are electrically isolated from the n− GaN layer 13. In an alternative embodiment, one or more ohmic contacts can be included on the surface of the substrate that is not covered by the n+ GaN layer 12. This embodiment is particularly applicable to substrates that are n-type. A Schottky metal layer 16 is included on the n− GaN layer 13, opposite the n+ GaN layer 12.

The work function of a metal is the energy needed to take an electron out of the metal in a vacuum and the Fermi level of a material is the energy level at which there is a 50% probability of finding a charged carrier. A semiconductor's electron affinity is the difference between its vacuum energy level and the conduction band energy level.

As described above, the surface Fermi level of GaN is unpinned and as a result, Schottky metals with different work functions result in different barrier potentials. The barrier potential is approximated by the equation:

Barrier Height=work function−the semiconductor's electron affinity

Figure 2:
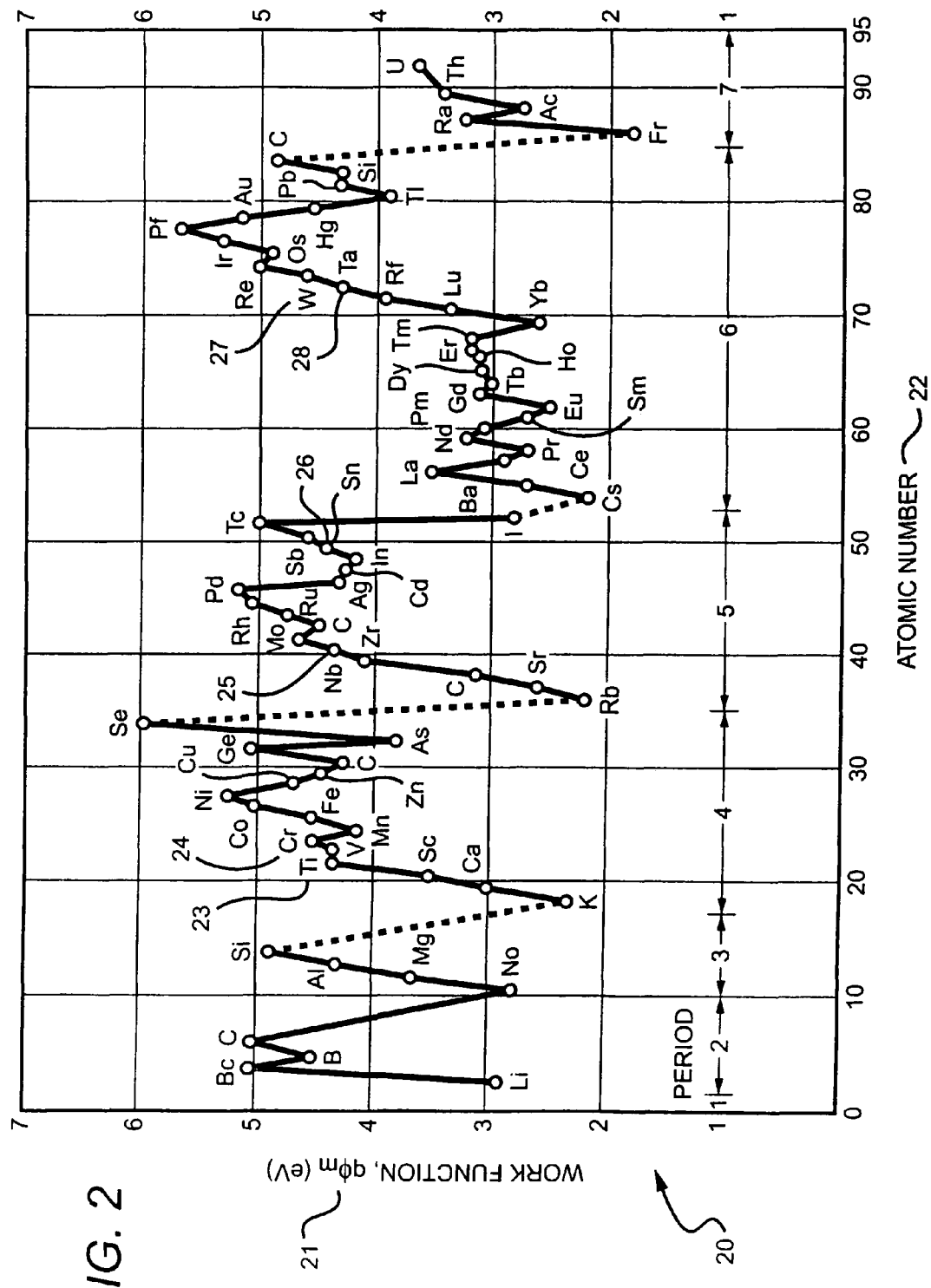
FIG. 2 is a diagram showing the work function of common metals verses their atomic number.

FIG. 2 is a graph 20 showing the metal work function 21 for various metal surfaces in a vacuum, verses the particular metal's atomic number 22. The metal should be chosen to provide a low Schottky barrier potential and low $V_f$, but high enough so that the reverse current remains low. For example, if a metal were chosen having a work function equal to the semiconductor's electron affinity, the barrier potential approaches zero. This results in a $V_f$ that approaches zero and also increases the diode's reverse current such that the diode becomes ohmic in nature and provides no rectification.

Many different metals can be used to achieve a low barrier height, with the preferred metals including Ti(4.6 work function) 23, Cr(4.7) 24, Nb(4.3) 25, Sn(4.4) 26, W(4.6) 27 and Ta (4.3) 28. Cr 24 results in an acceptable barrier potential and is easy to deposit by conventional methods.

Figure 3:
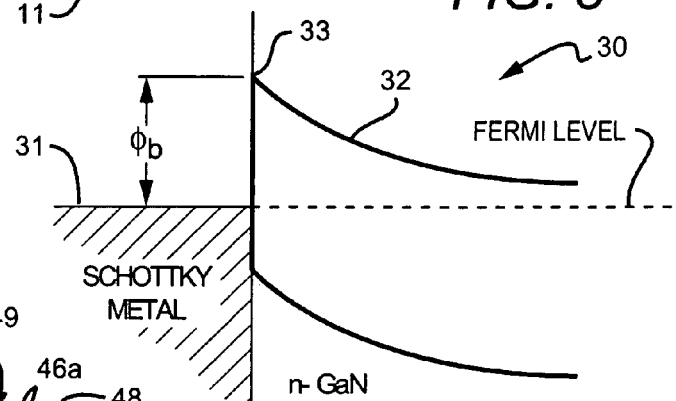
FIG. 3 is a band diagram for the diode shown in FIG. 1.

FIG. 3 shows a typical band diagram 30 for the new Schottky barrier diode taken on a vertical line through the diode. It shows the energy levels of Schottky metal 31, the GaN semiconductor layers 32, and the Shottky barrier potential 33.

Prior to contact of the GaN semiconductor material by the Schottky metal, the Fermi energy levels of the two are not the same. Once the contact is made and the two materials become a single thermodynamic system, a single Fermi level for the system results. This is accomplished by the flow of electrons from the semiconductor material, which has a higher Fermi level, to the Schottky metal, which has a lower Fermi level. The electrons of the semiconductor lower their energy by flowing into the metal. This leaves the ionized donor levels of the semiconductor somewhat in excess of the number of its free electrons and the semiconductor will have a net positive charge. Electrons that have flowed from the semiconductor into the metal cause the metal have a negative electrostatic charge. The energy levels of the semiconductor are accordingly depressed, and those of the metal are raised. The presence of this surface charge of electrons and the presence of unneutralized charge ionized donor levels of the semiconductor create the dipole layer which forms the barrier potential.

In operation, the signal to be rectified by the new Schottky diode 10 is applied across the Schottky metal 14 and the ohmic contacts 14a and 14b. The rectification of the signal results from the presence of the barrier potential at the surface of the n– GaN layer 13, which inhibits the flow of charged particles within the semiconductor. When the Schottky metal 16 is positive with respect to the semiconductor (forward bias), the energy at the semiconductor side of the barrier is raised. A larger number of free electrons on the conduction band are then able to flow into the metal. The higher the semiconductor side is raised, the more electrons there are at an energy above the top of the barrier, until finally, with large bias voltages the entire distribution of free electrons in the semiconductor is able to surmount the barrier. The voltage verses current characteristics become Ohmic in nature. The lower the barrier the lower the $V_f$ necessary to surmount the barrier.

However, as discussed above, lowering the barrier level can also increase the reverse leakage current. When the semiconductor is made positive with respect to the metal (reverse bias), the semiconductor side of the barrier is lowered relative to the metal side so that the electrons are free to flow over the top of the barrier to the semiconductor unopposed. The number of electrons present in the metal above the top of the barrier is generally very small compared to the total number of electrons in the semiconductor. The result is a very low current characteristic. When the voltage is large enough to cut-off all flow of electrons, the current will saturate. The lower the barrier potential, the smaller reverse biases needed for the current to saturate.

Figure 4:
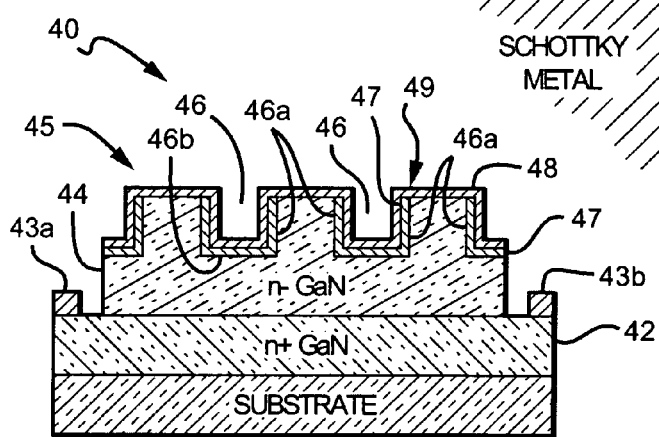
FIG. 4 is a sectional view of another embodiment of the GaN Schotty diode of FIG. 1, having a trench structure to reduce reverse current leakage.

FIG. 4 shows another embodiment of the new GaN Schottky diode 40 that addresses the problem of increased reverse current with decreased barrier height. The diode 40 is similar to the above embodiment having a similar substrate 41, n+ GaN layer 42, and Ohmic metal contacts 43a and 43b, that can alternatively be included on the surface of the substrate. It also has an n– GaN layer 44, but instead of this layer being planar, it has a two dimensional trench structure 45 that includes trenches 46 in the n–GaN layer. The preferred trench structure 45 includes trenches 46 that are parallel and equally spaced with mesa regions 49 remaining between adjacent trenches. Each trench 46 has an insulating layer 47 covering its sidewalls 46a and bottom surface 46b. Many different insulating materials can be used with the preferred material being silicon nitride (SiN). A Schottky metal layer 48 is included over the entire trench structure 45, sandwiching the insulating layer between the Schottky metal and the trench sidewalls and bottom surface, and covering the mesa regions 49. The mesa regions provide the direct contact area between the Schottky metal and the n– GaN layer 44. Alternatively, each trench can be covered by a metal instead of an insulator. In this embodiment, the Schottky metal should be insulated and/or separated from the trench metal.

The mesa region 49 has a doping concentration and width chosen to produce a redistribution of electrical field under the mesa's metal-semiconductor junction. This results in the peak of the diodes electrical field being pushed away from the Schottky barrier and reduced in magnitude. This reduces the barrier lowering with increased reverse bias voltage, which helps prevent reverse leakage current from increasing rapidly.

This redistribution occurs due to the coupling of the charge in the mesa 49 with the Schottky metal 48 on the top surface and with the metal on the trench sidewalls 46a and bottom surface 46b. The depletion then extends from both the top surface (as in a conventional Schottky rectifier) and the trench sidewalls 46a, depleting the conduction area from the sidewalls. The sidewall depletion reduces the electrical field under the Schottky metal layer 48 and can also be thought of as "pinching off" the reverse leakage current. The trench structure 45 keeps the reverse leakage current relatively low, even with a low barrier potentials and a low $V_f$.

The preferred trench structure 45 has trenches 46 that are one to two times the width of the Schottky barrier area. Accordingly, if the barrier area is 0.7 to 1.0 microns, the trench width could be in the range of 0.7 to 2 microns.

The above diodes 10 and 40 are fabricated using known techniques. Their n+ and n– GaN layers are deposited on the substrate by known deposition techniques including but not limited to metal-organic chemical vapor deposition (MOCVD). For diode 10, the n– GaN layer 13 is etched to the n+ GaN layer 12 by known etching techniques such as chemical, reactive ion etching (RIE), or ion mill etching. The Schottky and Ohmic metal layers 14, 14b and 16 are formed on the diode 10 by standard metallization techniques.

For diode 40, after the n+ and n– layers 42 and 44 are deposited on the substrate, the n– GaN layer 44 is etched by chemical or ion mill etching to form the trenches 46. The n– GaN layer 44 is further etched to the n+ GaN layer 42 for the ohmic metal 43a and 43b. The SiN insulation layer 47 is then deposited over the entire trench structure 45 and the SiN layer is etched off the mesas 49. As a final step, a continuous Schottky metal layer 48 is formed by standard metalization techniques over the trench structure 45, covering the insulation layers 47 and the exposed trench mesas 49. The ohmic metal is also formed on the n+ GaN layer 42 by standard metalization techniques. In the embodiments of the trench diode where the trenches are covered by a metal, the metal can also be deposited by standard metalization techniques.

Tunnel Diode

Figure 5:
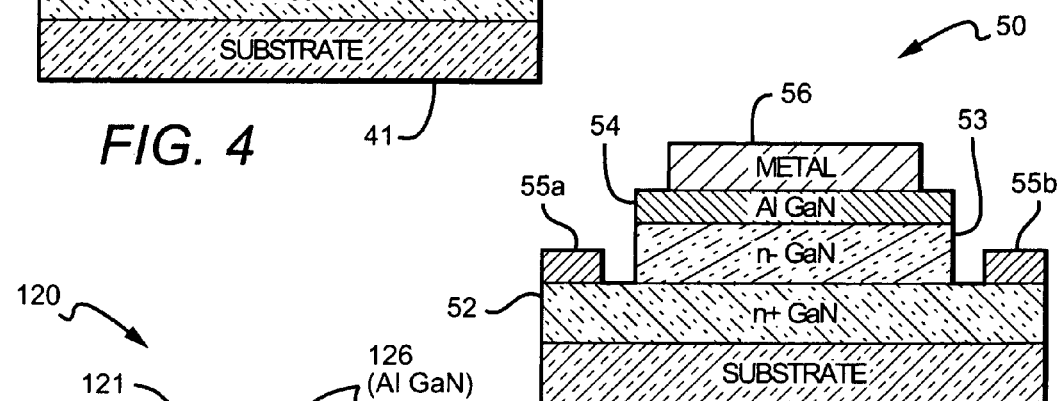
FIG. 5 is a sectional view of a tunnel diode embodiment of the invention.

FIG. 5 shows another embodiment 50 of the new diode wherein $V_f$ is low as a result of electron tunneling through the barrier region under forward bias. By tunneling through the barrier electrons do not need to cross the barrier by conventional thermionic emission over the barrier.

Like the embodiments in FIGS. 1 and 4, the new tunnel diode 50 is formed from the Group III nitride based material system and is preferably formed of GaN, AlGaN or InGaN, however other material systems will also work. Combinations of polar and non-polar materials can be used including polar on polar and polar on non-polar materials. Some examples of these materials include complex polar oxides such as strontium titanate, lithium niobate, lead zirconium titanate, and non-complex/binary oxides such as zinc oxide. The materials can be used on silicon or any silicon/dielectric stack as long as tunneling currents are allowed.

The diode 50 has a substrate 51 comprised of either sapphire, silicon carbide (SiC) or silicon Si, with SiC being the preferred substrate material for the reasons outlined above. The substrate has an n+ GaN layer 52 on it, with an n− GaN layer 53 on the n+ GaN layer 52 opposite the substrate 51. An AlGaN barrier layer 54 is included on the n− GaN layer opposite the n+ GaN template layer 52. At the edges of the diode 50, the barrier layer 54 and n− GaN layer 53 are etched down to the n+ GaN layer 52 and ohmic metal contacts 55a and 55b are included on the layer 52 in the etched areas. As with the above structures, the ohmic contacts can also be included on the surface of the substrate. A metal contact layer 56 is included on the AlGaN barrier layer 54, opposite the n−GaN layer 53. The signal to be rectified is applied across the ohmic contacts 55a and 55b and top metal contact 56.

The AlGaN barrier layer 54 serves as a tunnel barrier. Tunneling across barriers is a quantum mechanical phenomenon and both the thickness and the Al mole fraction of the layer 54 can be varied to maximize the forward tunneling probability. The AlGaN-GaN material system a has built in piezoelectric stress, which results in piezoelectric dipoles. Generally both the piezoelectric stress and the induced charge increases with the barrier layer thickness. In the forward bias, the electrons from the piezoelectric charge enhance tunneling since they are available for conduction so that the number of states from which tunneling can occur is increased. Accordingly the new tunnel diode can be made of other polar material exhibiting this type of piezoelectric charge.

However, under a reverse bias the piezoelectric charge also allows an increase in the reverse leakage current. The thicker the barrier layer or increased Al mole fraction, results in a lower $V_f$ but also results in an increased $I_{rev}$. Accordingly, there is an optimum barrier layer thickness for a particular Al mole fraction of the barrier layer to achieve operating characteristics of low $V_f$ and relatively low $I_{rev}$.

FIGS. 6-11 illustrate the new diode's rectification characteristics for three different thicknesses of an AlGaN barrier layer with 30% Al. For each thickness there is a band energy diagram and a corresponding voltage vs. current graph.

Figure 6:
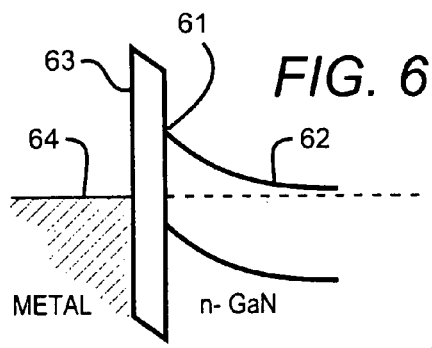
FIG. 6 is a band diagram for the tunnel diode of FIG. 5 having a barrier layer with a thickness of 22 Å and 30% Al mole fraction.
Figure 7:
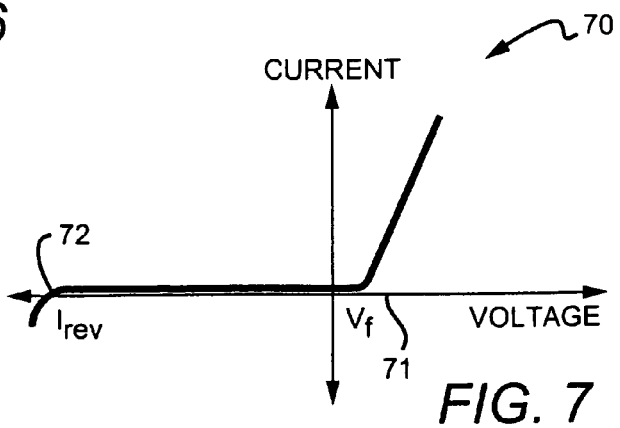
FIG. 7 is a diagram showing the voltage/current characteristics of the new tunnel diode having the band diagram of FIG. 6.

FIG. 6 shows the band diagram 60 for the tunnel diode 50 having 22A thick barrier layer 54. It shows a typical barrier potential 61 at the junction between the barrier layer 63 and the n− GaN semiconductor layer 62. The top contact metal 64 is on the barrier layer 63, opposite the semiconductor layer. FIG. 7 shows a graph 70 plotting the corresponding current vs. voltage characteristics of the diode in FIG. 6. It has a $V_f$ 71 of approximately 0.1V and low reverse current ($I_{rev}$) 72.

Figure 8:
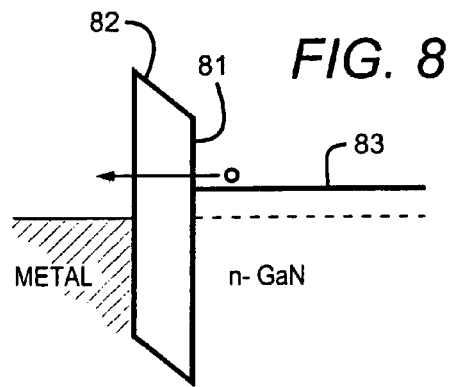
FIG. 8 is a band diagram for the tunnel diode of FIG. 5 having a barrier layer with a thickness of 30 Å and 30% Al mole fraction.
Figure 9:
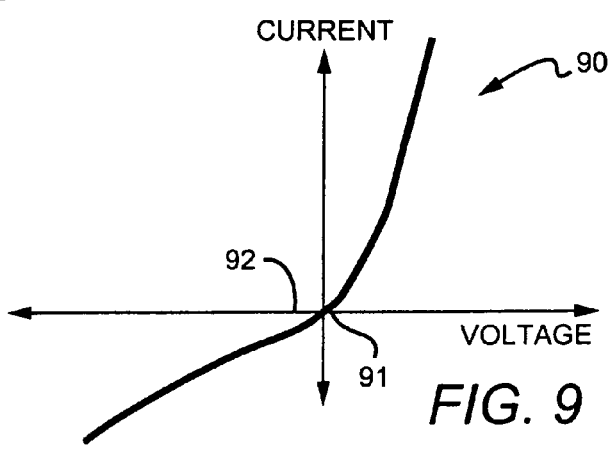
FIG. 9 is a diagram showing the voltage/current characteristics of the new tunnel diode having the band diagram of FIG. 8.

FIG. 8 shows a band diagram 80 for the same tunnel diode with a 30 Å thick barrier layer. The increase in the barrier layer thickness increases the barrier region's piezoelectric charge, thereby enhancing tunneling across the barrier. This flattens the barrier potential 81 at the junction between the barrier layer 82 and the n−GaN layer 83. Charges do not need to overcome the barrier when a forward bias is applied, greatly reducing the diode's $V_f$. However, the flattened barrier also allows for increase reverse leakage current ($I_{rev}$). FIG. 9 is a graph 90 showing the $V_f$ 91 that is lower than the $V_f$ in FIG. 7. Also, $I_{rev}$ 92 is increased compared to $I_{rev}$ in FIG. 7.

Figure 10:
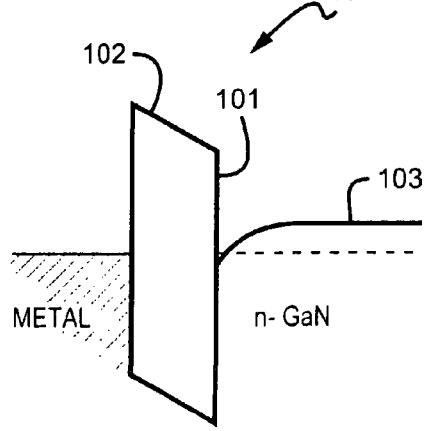
FIG. 10 is a band diagram for the tunnel diode of FIG. 5 having a barrier layer with a thickness of 38 Å and 30% Al mole fraction.
Figure 11:
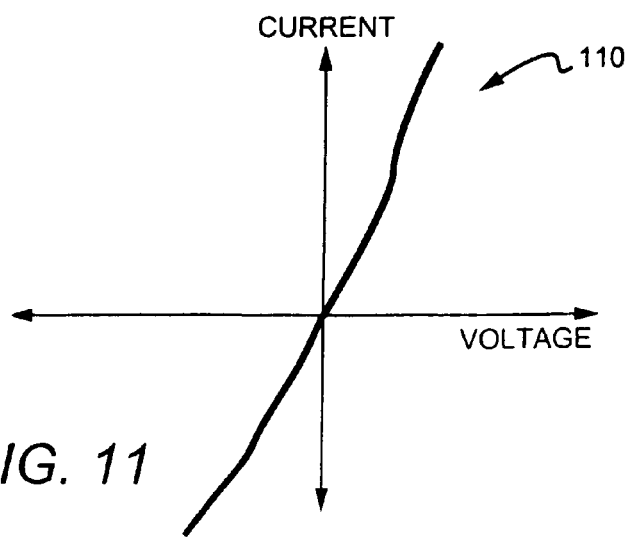
FIG. 11 is a diagram showing the voltage/current characteristics of the new tunnel diode having the band diagram of FIG. 10.

FIG. 10 shows a band diagram 100 for the same tunnel diode with a 38 Å thick barrier layer. Again, the increase in the barrier layer thickness increases the piezoelectric charge. At this thickness, the barrier potential 101 between the barrier layer 102 and n− GaN layer tails down near the junction between the barrier layer and n− GaN layer, which results in there being no barrier to charges in both forward and reverse bias. FIG. 11 shows a graph 110 of the corresponding current vs. voltage characteristics. The diode 100 experiences immediate forward and reverse current in response to forward and reverse bias such that the diode becomes ohmic in nature.

In the case where the mole concentration of aluminum in the barrier layer is different, the thicknesses of the layers would be different to achieve the characteristics shown in FIGS. 6 through 11.

Figure 12:
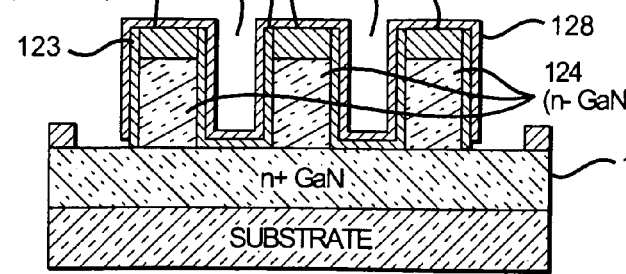
FIG. 12 is a sectional view of a tunnel diode embodiment of the invention having a trench structure to reduce reverse current leakage.

FIG. 12 shows the new tunneling diode 120 with a trench structure 121 to reduce reverse current. Like the Schottky diode 40 above, the trench structure includes a number of parallel, equally spaced trenches 122, but in this diode, they are etched through the AlGaN barrier layer 123 and the n−GaN layer 124, to the n+ GaN layer 125 (AP GaN Template). There are mesa regions 126 between adjacent trenches 122. The trench sidewalls and bottom surface have an insulation layer 127 with the top Schottky metal layer 128 covering the entire trench structure 121. The trench structure functions in the same way as the embodiment above, reducing the reverse current. This is useful for the tunnel diodes having barrier layers of a thickness that results in immediate forward current in response to forward voltage. By using trench structures, the diode could also have improved reverse current leakage. Also like above, the trench sidewalls and bottom surface can be covered by a metal as long as it is isolated from the Schottky metal layer 128.

Although the present invention has been described in considerable detail with reference to certain preferred configurations thereof, other versions are possible. Therefore, the spirit and scope of the appended claims should not be limited to the preferred versions described in the specification.

We claim:

1. A tunneling diode comprising:
   an n+ doped Group-III nitride semiconductor layer;
   an n− doped Group-III nitride semiconductor layer adjacent to a first side of said n+ doped layer;
   a Group-III nitride semiconductor barrier layer on said n− doped layer, with no semiconductor layers between said barrier layer and said n− doped layer,
   wherein an exposed portion of the surface of said first side of said n+ doped layer is not covered by said n− doped layer and said barrier layer;
   at least one ohmic contact on said exposed portion of said n+ doped layer;
   a metal layer on said barrier layer,
   said n+ doped, n− doped and barrier layers made from a material system having a piezoelectric stress, said piezoelectric stress related to the thickness of said barrier layer and causing said diode's on-state threshold voltage to be low as a result of enhanced electron tunneling through the potential barrier under forward bias; and
   wherein said layers are arranged in the following order: said n+ doped layer, said n− doped layer, said barrier layer, followed by said metal layer.

2. The diode of claim 1, wherein a portion of said piezoelectric stress localized in said barrier layer provides piezoelectric dipoles having electrons available for conduction to lower the diode's on-state threshold voltage by enhancing electron tunneling.

3. The diode of claim 1, wherein the number of said piezoelectric dipoles increases as the thickness of said barrier layer increases, while still allowing tunneling currents.

4. The diode of claim 1, further comprising a substrate adjacent to said n+ doped layer opposite said n− doped layer, said substrate comprising sapphire, silicon carbide or silicon.

5. The diode of claim 1, wherein said n+ doped layer, n− doped layer and barrier layer comprise polar materials.

6. The diode of claim 1, wherein said n+ doped layer, n− doped layer and barrier layer are from the Group III nitride material system.

7. The diode of claim 1, wherein said n+ doped layer is GaN, said n− doped layer is GaN, and said barrier layer is AlGaN.

8. The diode of claim 1, wherein said n+ doped layer, said n− doped layer and barrier layer are formed from polar materials.

9. The diode of claim 1, wherein said n+ doped layer, n− doped layer and barrier layer are formed from complex polar oxides.

10. The diode of claim 9, wherein said complex polar oxides comprise materials from the group consisting of strontium titanate, lithium niobate, lead zirconium titanate, or combinations thereof.

11. The diode of claim 1, wherein said n+ doped layer, n− doped layer and barrier layer are formed from binary polar oxides.

12. The diode of claim 11, wherein said binary polar oxides comprise zinc oxide.

13. The diode of claim 1, further comprising a trench structure in said barrier and n− doped layers, said diode experiencing a reverse leakage current under reverse bias, said trench structure reducing the amount of said reverse leakage current.

14. The diode of claim 13, wherein said trench structure comprises a plurality of trenches in said barrier and said n− layers having mesa regions between adjacent trenches, each of said trenches having opposing sidewalls and a bottom surface, said sidewalls and bottom surface of each of said trenches being coated by a layer of insulating material, said metal layer covering each of said trench's layer of insulating material and said mesa regions, so that each said layer of insulating material is sandwiched between said metal layer and its respective said sidewalls and bottom surface.

15. The diode of claim 14, wherein a portion of said insulating material is replaced by a metal with a high work function, said metal with a high work function being separated from said metal layer by said insulating material.

16. A tunneling diode comprising:
an n+ doped nitride semiconductor layer;
an n− doped nitride semiconductor layer adjacent to a first side of said n+ doped layer;
a barrier layer on said n− doped layer, with no semiconductor layers between said barrier layer and said n− doped layer,
wherein an exposed portion of the surface of said first side of said n+ doped layer is not covered by said n− doped layer and said barrier layer;
at least one ohmic contact on said exposed portion of said n+ doped layer;
a metal layer on said barrier layer,
said n− doped nitride layer forming a junction with said barrier layer, said junction having a potential barrier, said barrier layer having a spontaneous and piezoelectric polarization that results in dipoles having electrons available for conduction which causes said diode's on-state threshold voltage to be low as a result of electron tunneling through the potential barrier under forward bias; and
wherein said layers are arranged in the following order: said n+ doped layer, said n− doped layer, said barrier layer, followed by said metal layer.

* * * * *